(12) United States Patent
Kang

(10) Patent No.: US 9,601,527 B2
(45) Date of Patent: Mar. 21, 2017

(54) THIN FILM TRANSISTOR ARRAY SUBSTRATE, ORGANIC LIGHT-EMITTING DISPLAY APPARATUS, AND METHOD OF MANUFACTURING THE THIN FILM TRANSISTOR ARRAY SUBSTRATE

(71) Applicant: Samsung Display Co., Ltd., Yongin, Gyeonggi-do (KR)

(72) Inventor: Jae-Wook Kang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 23 days.

(21) Appl. No.: 14/538,739

(22) Filed: Nov. 11, 2014

(65) Prior Publication Data

US 2015/0171154 A1    Jun. 18, 2015

(30) Foreign Application Priority Data

Dec. 17, 2013   (KR) .......................... 10-2013-0157526

(51) Int. Cl.

| | |
|---|---|
| *H01L 29/08* | (2006.01) |
| *H01L 35/24* | (2006.01) |
| *H01L 51/00* | (2006.01) |
| *H01L 27/12* | (2006.01) |
| *H01L 23/532* | (2006.01) |
| *H01L 27/32* | (2006.01) |

(52) U.S. Cl.
CPC .... *H01L 27/1259* (2013.01); *H01L 23/53238* (2013.01); *H01L 27/124* (2013.01); *H01L 27/1255* (2013.01); *H01L 27/3246* (2013.01); *H01L 27/3258* (2013.01); *H01L 27/3272* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 2004/0080688 | A1 | 4/2004 | Ishida |
| 2004/0263708 | A1* | 12/2004 | Cho ................. G02F 1/136286 349/43 |
| 2008/0197342 | A1* | 8/2008 | Lee .................... H01L 27/3244 257/40 |

(Continued)

FOREIGN PATENT DOCUMENTS

JP        2012-235105 A        11/2012

*Primary Examiner* — Calvin Choi
(74) *Attorney, Agent, or Firm* — Lewis Roca Rothgerber Christie LLP

(57) ABSTRACT

A thin film transistor array substrate includes a thin film transistor including a first gate electrode, an active layer, a source electrode, and a drain electrode. A first conductive layer pattern is on a same layer as the source electrode and the drain electrode and formed of a same material as the source electrode and the drain electrode. An insulating layer is on the first conductive layer pattern and has an opening exposing a patterning cross-section of the first conductive layer pattern. A pixel electrode is on the insulating layer and is coupled to the source electrode or the drain electrode through a contact hole passing through the insulating layer. A diffusion prevention layer covers the patterning cross-section of the first conductive layer pattern and inclined side surfaces of the insulating layer exposed through the opening.

25 Claims, 14 Drawing Sheets

(56) References Cited

U.S. PATENT DOCUMENTS

| | | | |
|---|---|---|---|
| 2008/0308826 A1 | 12/2008 | Lee et al. | |
| 2012/0112182 A1 | 5/2012 | Ishii et al. | |
| 2012/0211777 A1* | 8/2012 | Kang | H01L 27/3258 257/88 |
| 2012/0292621 A1* | 11/2012 | Kim | H01L 27/3223 257/59 |

* cited by examiner

THIN FILM TRANSISTOR ARRAY SUBSTRATE, ORGANIC LIGHT-EMITTING DISPLAY APPARATUS, AND METHOD OF MANUFACTURING THE THIN FILM TRANSISTOR ARRAY SUBSTRATE

CROSS-REFERENCE TO RELATED APPLICATION

This application claims priority to and the benefit of Korean Patent Application No. 10-2013-0157526, filed on Dec. 17, 2013, in the Korean Intellectual Property Office, the disclosure of which is incorporated herein in its entirety by reference.

BACKGROUND

1. Field

Aspects of embodiments of the present invention are directed toward a thin film transistor array substrate, an organic light-emitting display apparatus, and a method of manufacturing the thin film transistor array substrate.

2. Description of the Related Art

A thin film transistor array substrate including a thin film transistor, a capacitor, and a wire connecting the thin film transistor and the capacitor has been widely used in a flat panel display apparatuses, such as a liquid-crystal display apparatus or an organic light-emitting display apparatus.

In an organic light-emitting display apparatus using (e.g., utilizing) a thin film transistor array substrate, a plurality of gate lines and data wires are arranged in a matrix form to define pixels. Each pixel includes a thin film transistor, a capacitor, and an organic light-emitting device connected to the thin film transistor and the capacitor. The organic light-emitting device displays a desired image when a driving signal is applied thereto from the thin film transistor and the capacitor.

SUMMARY

Aspects of embodiments of the present invention are directed toward a light-emitting display apparatus with excellent device characteristics and high display quality.

An embodiment of the present invention provides a thin film transistor array substrate including: a thin film transistor including a gate electrode, an active layer, a source electrode, and a drain electrode; a first conductive layer pattern on a same layer as the source electrode and the drain electrode and formed of a same material as the source electrode and the drain electrode; an insulating layer on the first conductive layer pattern, the insulating layer having an opening exposing a patterning cross-section of the first conductive layer pattern; a pixel electrode on the insulating layer and coupled to either the source electrode or the drain electrode through a contact hole passing through the insulating layer; and a diffusion prevention layer covering the patterning cross-section of the first conductive layer pattern and inclined side surfaces of the insulating layer exposed through the opening.

The first conductive layer pattern may include: a metal layer including a copper or a copper alloy; and a first barrier layer interposed between the metal layer and the insulating layer.

A patterning cross-section of the metal layer may be flush with a patterning cross-section of the first barrier layer.

The first barrier layer may include indium tin oxide (ITO), indium zinc oxide (IZO), molybdenum (Mo), molybdenum nitride (MoN), molybdenum-niobium (MoNb), molybdenum-vanadium (MoV), molybdenum-titanium (MoTi), and/or molybdenum-tungsten (MoW).

The first conductive layer pattern may further include a second barrier layer underneath the metal layer.

A patterning cross-section of the metal layer may be flush with a patterning cross-section of the second barrier layer.

The second barrier layer may include indium tin oxide (ITO), indium zinc oxide (IZO), molybdenum (Mo), molybdenum nitride (MoN), molybdenum-niobium (MoNb), molybdenum-vanadium (MoV), molybdenum-titanium (MoTi), and/or molybdenum-tungsten (MoW).

The first conductive layer pattern may include the source electrode and the drain electrode of a second thin film transistor, an electrode of a capacitor, a data wire, and/or a driving wire.

The insulating layer may include an organic insulating material.

The insulating layer may contact an upper portion of the first conductive layer pattern.

The diffusion prevention layer may include a same material as the pixel electrode.

The diffusion prevention layer may contact the patterning cross-section of the first conductive layer pattern.

The diffusion prevention layer may contact the patterning cross-section of the insulating layer exposed through the opening.

The diffusion prevention layer may include a plurality of patterns which are insulated from each other.

The thin film transistor array substrate may further include a pixel-defining film on the insulating layer, and the pixel-defining film may include an opening configured to expose a top surface of the pixel electrode.

The pixel-defining film may include an organic insulating material.

The thin film transistor may be a bottom gate thin film transistor.

The thin film transistor may be a top gate thin film transistor.

Another embodiment of the present invention provides an organic light-emitting display apparatus including: a substrate; a thin film transistor on the substrate and including a gate electrode, an active layer, a source electrode, and a drain electrode; a first conductive layer pattern on a same layer as the source electrode and the drain electrode and formed of a same material as the source electrode and the drain electrode; an insulating layer having an opening exposing a patterning cross-section of the first conductive layer pattern; a pixel electrode on the insulating layer and coupled to either the source electrode or the drain electrode through a contact hole passing through the insulating layer; a diffusion prevention layer covering the patterning cross-section of the first conductive layer pattern and inclined side surfaces of the insulating layer exposed through the opening; an organic light-emitting layer on the pixel electrode; and an opposite electrode on the organic light-emitting layer.

At least one of the pixel electrode and the opposite electrode may be a transmissible electrode.

A method of manufacturing a thin film transistor array substrate according to an embodiment of the present invention includes: forming a thin film transistor including a gate electrode, an active layer, a source electrode, and a drain electrode on a substrate; forming a first conductive layer pattern on a same layer as the source electrode and the drain electrode and of a same material as the source electrode and the drain electrode; forming an insulating layer on the first conductive layer pattern, the insulating layer having an opening exposing a cross-section of the first conductive layer pattern; forming a diffusion prevention layer covering the cross-section of the first conductive layer pattern and inclined side surfaces of the insulating layer exposed through the opening; and forming a pixel electrode coupled to the source electrode or the drain electrode, concurrently (e.g., together) with the diffusion prevention layer.

The forming of the first conductive layer pattern may include: forming (e.g., depositing) a metal layer including a copper or a copper alloy; continuously forming (e.g., depositing) a first barrier layer on the metal layer in a same chamber; and concurrently (e.g., simultaneously) patterning the metal layer and the first barrier layer.

In one embodiment, a second barrier layer is further formed (e.g., deposited) underneath the metal layer, the second barrier layer, the metal layer, and the first barrier layer are continuously formed (e.g., deposited) in a same chamber, and the second barrier layer, the metal layer, and the first barrier layer are concurrently (e.g., simultaneously) patterned.

In one embodiment, the method further includes, forming a pixel-defining film on the insulating layer, the pixel-defining film configured to expose a top surface of the pixel electrode.

The insulating layer and the pixel-defining film each may include an organic insulating material.

Another embodiment of the present invention provides a thin film transistor array substrate including: a thin film transistor including a gate electrode, an active layer, a source electrode, and a drain electrode; a first conductive layer pattern on a same layer as the source electrode and the drain electrode; a first electrode on the first conductive layer pattern; and a protection layer on a same layer as the first electrode and contacting both side walls of the first conductive layer pattern.

In one embodiment, the first conductive layer pattern includes: a metal layer including a copper or a copper alloy; and a first barrier layer on the metal layer.

A patterning cross-section of the metal layer may be flush with a patterning cross-section of the first barrier layer.

The protection layer may include a same material as the first electrode.

The protection layer may contact (e.g., directly contact) the patterning cross-section of the first conductive layer pattern.

Another embodiment of the present invention provides a thin film transistor array substrate including: a thin film transistor including a gate electrode, an active layer, a source electrode, and a drain electrode; a first conductive layer pattern on a same layer as the source electrode and the drain electrode; a first electrode on the first conductive layer pattern; a first insulating layer on the first electrode; and a protection layer contacting both side walls of the first conductive layer pattern and the first insulating layer.

The first insulating layer may include an organic insulating material.

The thin film transistor array substrate may further include a second electrode on the first insulating layer, the second electrode including a same material as the first electrode.

Other aspects, features, and advantages than those described above may be realized by a person having ordinary skill in the art in view of the following sections including the brief description of the drawings, the claims, and the detailed description.

BRIEF DESCRIPTION OF THE DRAWINGS

These and/or other aspects will be apparent and readily appreciated by those having ordinary skill in the art from the following description of the embodiments, taken in conjunction with the accompanying drawings in which.

DETAILED DESCRIPTION

Figure 1:
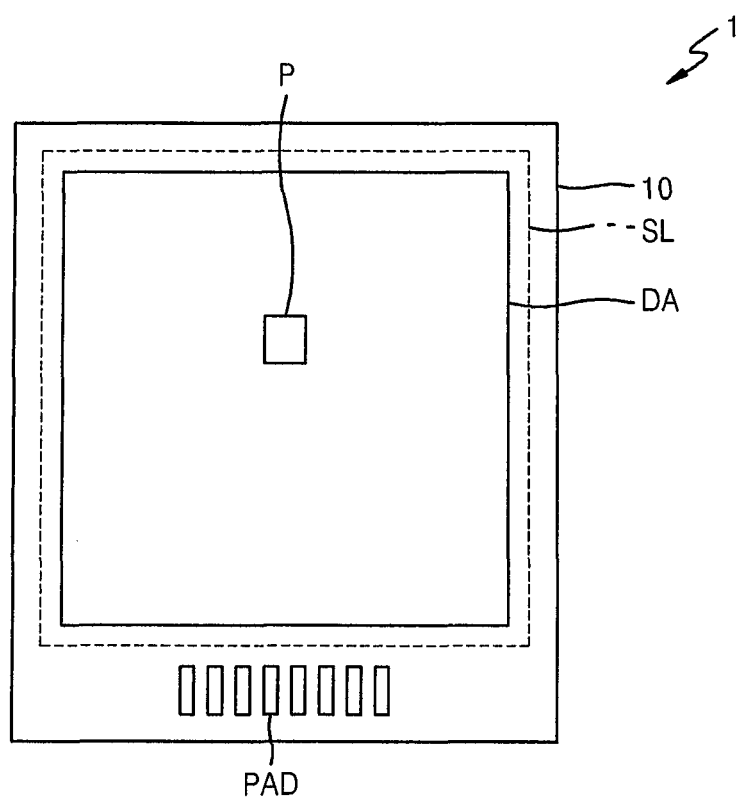
FIG. 1 is a schematic plan view of a display apparatus according to an embodiment of the present invention.

Reference will now be made in detail to example embodiments of the present invention, examples of which are illustrated in the accompanying drawings, wherein like reference numerals refer to like elements throughout. In this regard, the present embodiments may have various forms and should not be construed as being limited to the descriptions set forth herein. Accordingly, the embodiments are merely described below, by reference to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The present invention may be variously modified and may have several embodiments. Accordingly, embodiments will be illustrated in the drawings and described in the detailed description as examples only. The effects and features of the present invention, and implementation methods thereof, may be clarified through the description of the following embodiments with reference to the accompanying drawings. The present invention may, however, be embodied in various different forms and should not be construed as limited to the embodiments set forth herein.

Embodiments of the present invention are described below in detail with reference to the accompanying drawings, and when referring to the drawings, the same or similar components are denoted by the same reference numerals and are not repetitively described.

It will be understood that, although the terms "first", "second", etc. may be used herein to describe various components, these components should not be limited by these terms. Instead, these terms are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of the stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, one or more intervening layers, regions, or components may be present.

Sizes of elements in the drawings may be exaggerated for the convenience of illustration. In other words, since sizes and thicknesses of components in the drawings are arbitrarily illustrated for the convenience of illustration, the embodiments of the present invention are not limited thereto.

When a certain embodiment may be implemented differently, a specific process order may be performed differently from the described order. For example, two consecutively described processes may be performed at substantially the same time or performed in an order that is the same or opposite to the described order.

Figure 2:
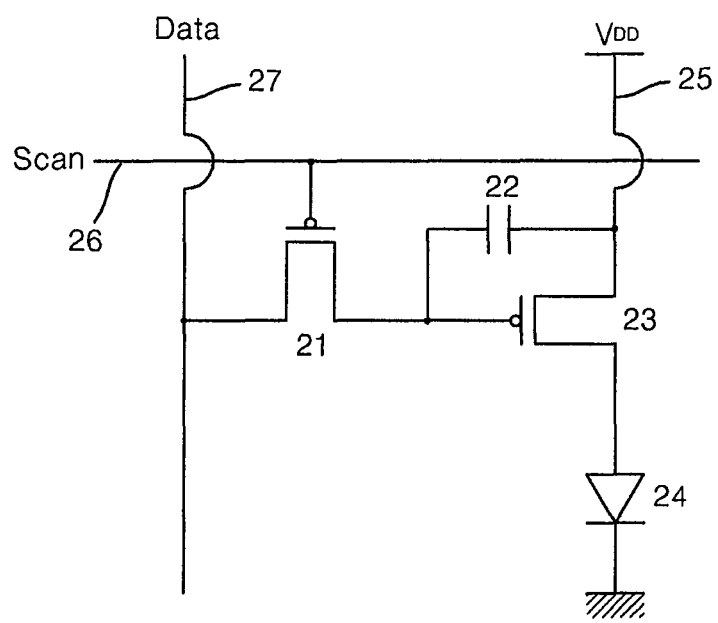
FIG. 2 shows a circuit diagram of a pixel of the display apparatus of FIG. 1.

FIG. 1 is a schematic plan view of a display apparatus according to an embodiment of the present invention. FIG. 2 shows a circuit diagram of a pixel of the display apparatus of FIG. 1.

Referring to FIG. 1, a display area DA including a plurality of pixels P for displaying an image is located on a substrate 10 of the display apparatus 1. The display area DA is located inside a sealing line SL, and an encapsulation member encapsulating the display area DA is formed along the sealing line SL.

A plurality of pixels P, each including a thin film transistor and an organic light-emitting device, are arranged on the display area DA. The pixels P may each include, as illustrated in the circuit diagram of FIG. 2, a driving wire 25, a data wire 27, a scan line 26, a first transistor 21 that is a switching transistor, a storage capacitor 22, a second transistor 23 that is a driving transistor, and a light-emitting device 24.

According to an embodiment of the present invention, when a signal of the scan line 26 is active, a voltage level of the data wire 27 is stored in the storage capacitor 22 through the first transistor 21. The second transistor 23 generates a light-emitting current IOLED according to a gate voltage Vgs that is determined according to a voltage level stored in the storage capacitor 22, and provides the generated current IOLED to the light-emitting device 24. According to an embodiment of the present invention, the light-emitting device 24 may be an organic light-emitting diode.

Figure 3:
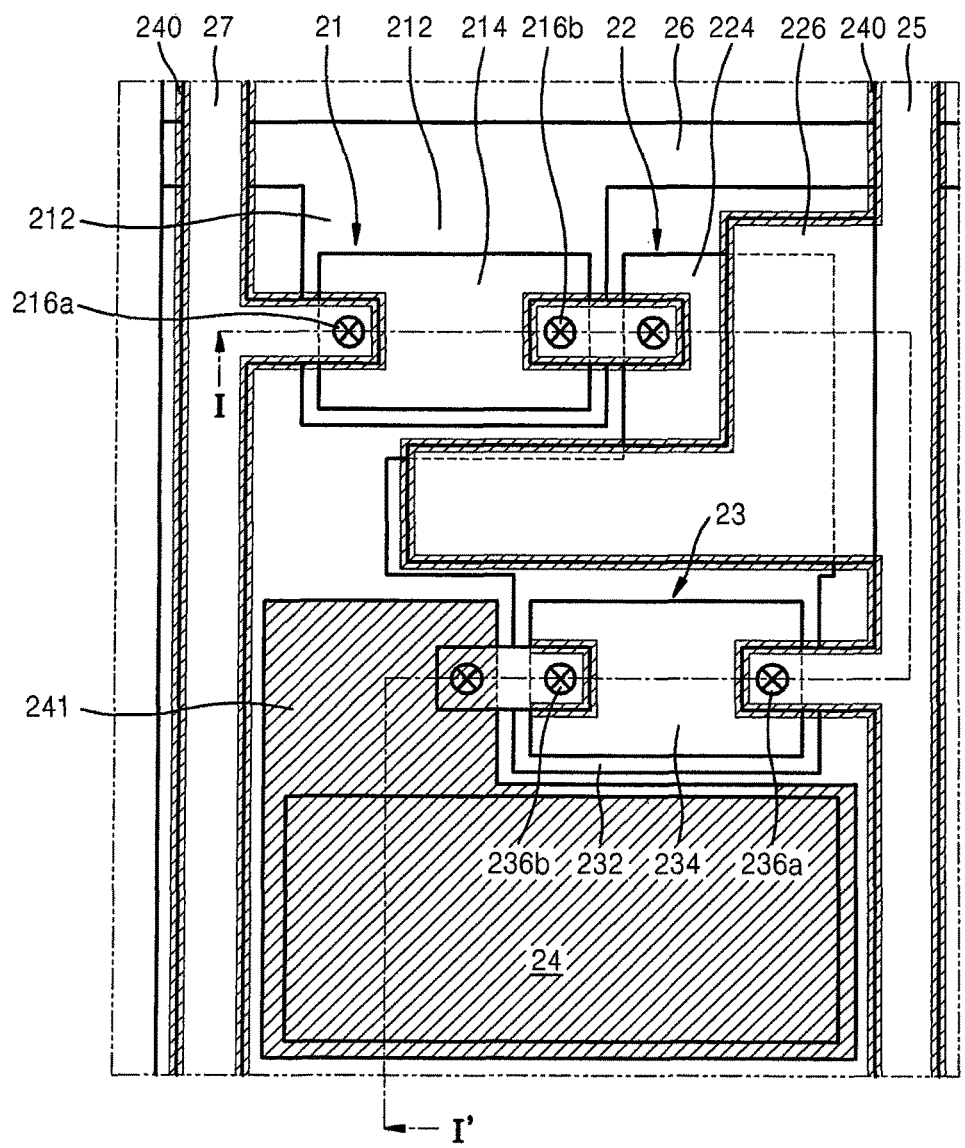
FIG. 3 is an enlarged view of a portion of a display area according to an embodiment of the present invention.
Figure 4:
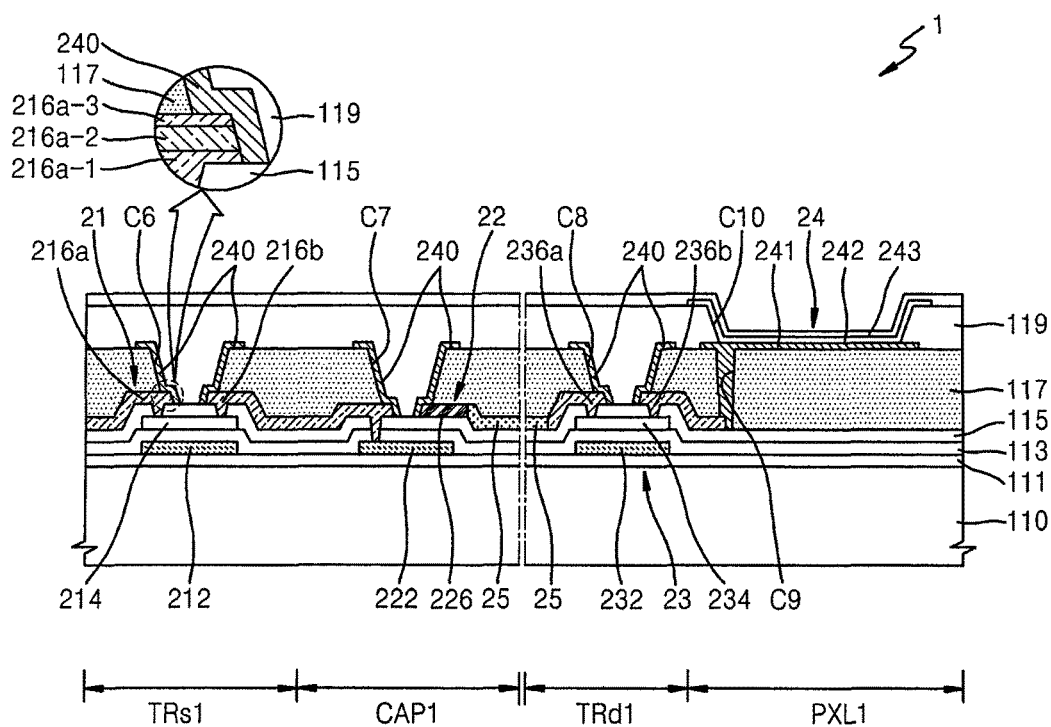
FIG. 4 is a cross-sectional view taken along the line 1-1' of FIG. 3.

Hereinafter, the display apparatus 1 according to a first embodiment of the present invention will be described in detail by referring to FIGS. 3 and 4. FIGS. 3 and 4 illustrate a display apparatus using (e.g., utilizing) a bottom-gate thin film transistor configured as either a driving transistor or a switching transistor, according to an embodiment of the present invention.

FIG. 3 is an enlarged view of a portion of the display area DA according to an embodiment of the present invention. FIG. 4 is a cross-sectional view taken along the line I-I' of FIG. 3.

In the display apparatus 1 according to the present embodiment, each of the pixels that constitute the display area DA includes the first transistor 21 for switching, the second transistor 23 for driving, the capacitor 22, and the light-emitting device 24. The number of transistors and capacitors are provided for illustrative purposes only, and embodiments of the present invention are not limited thereto.

A first transistor area TRs1 including at least one switching thin film transistor, a capacitor area CAP1 including at least one storage capacitor, a second transistor area TRd1 including at least one driving thin film transistor, and a pixel area PXL1 including at least one organic layer are positioned on the substrate 110.

The first transistor area TRs1 includes the substrate 110, a buffer layer 111, the first transistor 21, and a diffusion prevention layer 240.

The first transistor 21 includes a first gate electrode 212, a first active layer 214, a source electrode 216a, and a drain electrode 216b. The first source electrode 216a is coupled (e.g., connected) to the data wire 27 to provide a data signal to the first active layer 214. The first drain electrode 216b is coupled to a first electrode 222 of the capacitor 22 to store a data signal in the capacitor 22.

The substrate 110 may be a glass substrate, or a plastic substrate including polyethylene terephthalate (PET), polyethylene naphthalate (PEN), or polyimide. The buffer layer 111 may be further located on the substrate 110 to form a substantially flat surface, and to substantially prevent permeation of impurity elements. The buffer layer 111 may have a single or multi-layered structure, formed of at least one selected from silicon nitride and silicon oxide.

In the first transistor area TRs1, the first gate electrode 212 of the first transitor 21 is positioned on the buffer layer 111. The first gate electrode 212 may have, for example, a single or multi-layered structure formed of at least one metal selected from aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu).

A first insulating layer 113 that is a gate insulating film is positioned on the first gate electrode 212.

The first active layer 214 is positioned on the first insulating layer 113. The first active layer 214 may include an oxide semiconductor. For example, the first active layer 214 may include G-I—Z—O[a(In$_2$O$_3$)$_b$(Ga$_2$O$_3$)$_c$(ZnO) layer](a, b, and c are respectively real numbers complying with conditions of a≥0, b≥0, and c>0), and according to another embodiment, the first active layer 214 may include an oxide of a material selected from Groups 12, 13, and 14 elements, such as zinc (Zn), indium (In), gallium (Ga), tin (Sn), cadmium (Cd), germanium (Ge), hafnium (Hf), or a combination thereof.

A transistor including an oxide semiconductor as the first active layer 214 may have superior device characteristics, and enables low-temperature processes, thereby being a device suitable for a back plane for a flat panel display. In addition, a transistor including an oxide semiconductor has transmissible characteristics in a visible range, as well as flexible characteristics.

A second insulating layer 115, which may be an interlayer insulating layer and an etch stopper, is positioned on the first active layer 214. The second insulating layer 115 may protect the first active layer 214 from being substantially damaged when the first source electrode 216a and the first drain electrode 216b are damaged.

The first source electrode 216a and the first drain electrode 216b are positioned on the second insulating layer 115. The first source electrode 216a and the first drain electrode 216b may each be a part of a conductive layer pattern that is formed when the data wire 27, the driving wire 25, a second source electrode 236a, a second drain electrode 236b, and a second electrode 226 of the capacitor 22 are formed.

The first source electrode 216a and the first drain electrode 216b may include a metal layer 216a-2, a first barrier layer 216a-3 positioned above the metal layer 216a-2, and a second barrier layer 216a-1 positioned under the metal layer 216a-2. For ease of illustration in FIG. 4, only a portion of the first source electrode 216a is enlarged to show the metal layer 216a-2, the first barrier layer 216a-3, and the second barrier layer 216a-1. However, the first drain electrode 216b may also have a substantially same structure as the first source electrode 216a illustrated in the enlarged portion of FIG. 4. Further, similar to the first source electrode 216a and the first drain electrode 216b, a different conductive layer pattern formed of substantially the same material on a same layer as the first source electrode 216a and the first drain electrode 216b, may have substantially the same layered structure as the first source electrode 216a. For example, a second source electrode 236a, a second drain electrode 236b, the data wire 27, the driving wire 25, and/or the second electrode 226 of the capacitor 22 may have substantially the same layered structure as the first source electrode 216a. The metal layer 216a-2 may include copper or a copper alloy. In the present embodiment, the metal layer 216a-2 includes copper or a copper alloy, but embodiments of the present invention are not limited thereto. For example, the metal layer 216a-2 may include a metal having a resistance that is smaller than or substantially equivalent to that of copper or copper alloy.

The first barrier layer 216a-3 may substantially prevent diffusion of a material included in the metal layer 216a-2, and oxidation of the metal layer 216a-2. The first barrier layer 216a-3 may include indium tin oxide (ITO), indium zinc oxide (IZO), molybdenum (Mo), molybdenum nitride (MoN), molybdenum-niobium (MoNb), molybdenum-vanadium (MoV), molybdenum-titanium (MoTi), or molybdenum-tungsten (MoW).

The second barrier layer 216a-1 may substantially prevent diffusion of a material included in the metal layer 216a-2 to the layers underneath the metal layer 216a-2, and may increase an adhesive force with the second insulating layer 115 positioned below the metal layer 216a-2. The second barrier layer 216a-1 may include indium tin oxide (ITO), indium zinc oxide (IZO), molybdenum (Mo), molybdenum nitride (MoN), molybdenum-niobium (MoNb), molybdenum-vanadium (MoV), molybdenum-titanium (MoTi), or molybdenum-tungsten (MoW).

Patterning cross-sections of the second barrier layer 216a-1, metal layer 216a-2, and first barrier layer 216a-3 of the first source electrode 216a may be flush with each other. For example, the second barrier layer 216a-1, the metal layer 216a-2, and the first barrier layer 216a-3 may be continuously deposited in the same chamber, and concurrently (e.g., simultaneously) patterned in the same patterning process.

A planarization layer 117 is positioned on the second insulating layer 115 to cover the first source electrode 216a and the second drain electrode 216b. The planarization layer 117 may be an organic insulating film. For example, the planarization layer 117 may include a commercially available polymer PMMA, PS, a polymer derivative having a phenol group, an aryl-based polymer, an imide-based polymer, an arylether-based polymer, an amide-based polymer, a fluorine-based polymer, a p-xylene-based polymer, a vinylalcohol-based polymer, or a blend thereof. A third insulating layer 119 is positioned on the planarization layer 117 while exposing an upper portion of a pixel electrode 241 to define a pixel area. The third insulating layer 119 may be an organic insulating layer. The third insulating layer 119 may include a commercially available polymer PMMA, PS, a polymer derivative having a phenol group, an aryl-based polymer, an imide-based polymer, an arylether-based polymer, an amide-based polymer, a fluorine-based polymer, a p-xylene-based polymer, a vinylalcohol-based polymer, or a blend thereof.

When a layer including an organic insulating material, such as the planarization layer 117 or the third insulating layer 119, is manufactured, a heat process is performed. During the heat process, metal included in the metal layer 216a-2 may diffuse. When the metal layer 216a-2 includes a copper or a copper alloy, the diffusion may be further promoted.

Although the first barrier layer 216a-3 and the second barrier layer 216a-1 respectively positioned above and below the metal layer 216a-2 may substantially prevent diffusion of the metal layer 216a-2 to the layers above or below the metal layer 216a-2, the diffusion through a side of the metal layer 216a-2 pattern exposed by the first barrier layer 216a-3 and the second barrier layer 216a-1 may not be substantially prevented. When the side of the metal layer 216a-2 pattern directly contacts an organic insulating layer, a metal material diffused through the organic insulating layer may further diffuse into other portions of the display apparatus 1. The diffused metal material may cause defects in the display apparatus 1, leading to a decrease in display quality thereof.

According to an embodiment of the present invention, to substantially prevent the direct contact between the patterning cross-section of the metal layer 216a-2 of the first source electrode 216a and an organic insulating film, such as the planarization layer 117 or the third insulating layer 119, a diffusion prevention layer 240 may be formed along cross-sections of the first source electrode 216a and the first drain electrode 216b. Referring to FIG. 4, an opening C6 is formed in the planarization layer 117 positioned on the first source electrode 216a. Along the opening C6 of the planarization layer 117, the diffusion prevention layer 240 may be formed to cover the patterning cross-sections of the first source electrode 216a and the first drain electrode 216b. Since the patterning cross-sections of the first source electrode 216a and the first drain electrode 216b may not contact an organic insulating film material due to the diffusion prevention layer 240 interposed therebetween, the diffusion may be substantially prevented. The diffusion prevention layer 240 may cover inclined surfaces of the planarization layer 117 patterned by the opening C6, that is, an inclined surface of the first source electrode 216a and an inclined surface of the first drain electrode 216b.

The diffusion prevention layer 240 may be formed of substantially the same material on the same layer as the pixel electrode 241 of the pixel area PXL1, which will be described in detail below. Accordingly, even without an additional use of a mask, a source electrode and a drain electrode of a thin film transistor may be protected.

In the embodiment described above, the diffusion prevention layer 240 is provided to protect the patterning cross-sections of the first source electrode 216a and the first drain electrode 216b. However, the diffusion prevention layer 240 may also be applicable to a different conductive layer that constitutes a conductive layer pattern including the first source electrode 216a and the first drain electrode 216b. For example, the diffusion prevention layer 240 may be formed along patterning cross-sections of the second source electrode 236a, the second drain electrode 236b, the data wire 27, the driving wire 25, and the second electrode 226 of the capacitor 22.

In more detail, referring to FIG. 3, the diffusion prevention layer 240 is shown according to an embodiment of the present invention. Referring to FIG. 3, the diffusion prevention layer 240 is formed along patterning cross-sections of the first source electrode 216a, the first drain electrode 216b, the second source electrode 236a, the second drain electrode 236b, the data wire 27, the driving wire 25, and the second electrode 226 of the capacitor 22. Also, referring to FIG. 4, the diffusion prevention layer 240 according to an embodiment of the present invention covers the inclined surfaces of the planarization layer 117 patterned by the openings exposing the patterning cross-sections.

The second transistor area TRd1 includes the second transistor 23 corresponding to the first transistor 21 of the first transistor area TRs1. In more detail, a second gate electrode 232, second active layer 234, second source electrode 236a, and second drain electrode 236b of the second transistor 23 respectively correspond to the first gate electrode 212, first active layer 214, first source electrode 216a, and first drain electrode 216b of the first transistor 21.

The second source electrode 236a of the second transistor 23 is coupled (e.g., connected) to the driving wire 25, and supplies a reference voltage to the second active layer 234. The second drain electrode 236b couples (e.g., connects) the second transistor 23 to the light-emitting device 24 to apply a driving power to the light-emitting device 24.

The pixel area PXL1 includes the light-emitting device 24 including the pixel electrode 241, an intermediate layer 242, and an opposite electrode 243.

The pixel electrode 241 contacts the second drain electrode 236b through a contact hole C9 formed through the planarization layer 117. A third insulating layer 119 may be a pixel-defining layer formed on the pixel electrode 241. The intermediate layer 242, including an organic light-emitting layer, is formed inside an opening C10 formed in the third insulating layer 119.

When the display apparatus 1 is a bottom emission display apparatus, the pixel electrode 241 may be a transmissible electrode, and when the display apparatus 1 is a top emission display apparatus, the pixel electrode 241 may be a reflective electrode. When the pixel electrode 241 is a transmissible electrode, the pixel electrode 241 may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). According to an embodiment, the pixel electrode 241 has a three-layered structure including a transmissible conductive oxide layer/a semi-transmissible metal layer/a transmissible conductive oxide layer.

When the pixel electrode 241 is a reflective electrode, the reflective electrode may be formed to include a reflective film (formed by aluminum (Al), platinum (Pt), palladium (Pd), silver (Ag), magnesium (Mg), gold (Au), nickel (Ni), neodymium (Nd), iridium (Ir), chromium (Cr), magnesium (Mg), or a mixture thereof, and indium tin oxide (ITO), indium zinc oxide (IZO), zinc oxide (ZnO), indium oxide ($In_2O_3$), indium gallium oxide (IGO), and/or aluminum zinc oxide (AZO)) deposited thereon.

The intermediate layer 242 is positioned on the pixel electrode 241 exposed through the opening C10 of the third insulating layer 119. The intermediate layer 242 may include an organic light-emitting layer configured to emit red light, green light, or blue light, and the organic light-emitting layer may include a low molecular weight organic material or a polymer organic material. When the organic light-emitting layer is a low molecular weight organic layer formed of a low molecular weight organic material, a hole transport layer (HTL), a hole injection layer (HIL), and so on may be positioned in a direction from the organic light-emitting layer towards the pixel electrode 241, and an electron transport layer (ETL), an electron injection layer (EIL), and so on may be positioned in a direction from the organic light-emitting layer towards the opposite electrode 243. In other embodiments, various other layers, in addition to the HIL, the HTL, the ETL, and the EIL, may be deposited, if needed. In the embodiment described above, each pixel includes a separate organic light-emitting layer. The separate pixels are respectively configured to emit a red light, a green light, and a blue light, and a pixel emitting the red light, a pixel emitting the green light, and a pixel emitting the blue light may constitute a unit pixel. However, embodiments of the present invention are not limited thereto, and all of the pixels may share one common organic light-emitting layer. For example, a plurality of organic light-emitting layers respectively emitting red light, green light, and blue light may be vertically stacked or mixed to emit white light. However, a combination of light for the emission of white light is not limited thereto. In an embodiment, a color conversion layer or a color filter may be separately used (e.g., utilized) to change the emitted white light into a particular color of light.

The opposite electrode 243 facing the pixel electrode 241 is positioned on the intermediate layer 242. The opposite electrode 243 may also be a transmissible electrode or a reflective electrode. When the opposite electrode 243 is a transmissible electrode, a low-work function metal, such as Li, Ca, LiF/Ca, LiF/Al, Al, Ag, Mg, or a mixture thereof, may be deposited having a small thickness toward the organic light-emitting layer, and a transmissible conductive oxide, such as ITO, IZO, ZnO, or $In_2O_3$, may be desposited to form an auxiliary electrode layer or a bus electrode line. When the opposite electrode 243 is a reflective electrode, Li, Ca, LiF/Ca, LiF/Al, Al, Ag, Mg, or a mixture thereof may be deposited on the resultant structure to form the reflective electrode. However, embodiments of the present invention are not limited thereto, for example, an organic material, such as a conductive polymer, may be used (e.g., utilized) to form the pixel electrode 241 and/or the opposite electrode 243.

The capacitor area CAP1 includes the buffer layer 111, the first electrode 222 positioned on the same layer as the first gate electrode 212, the second electrode 226 positioned on the same layer as the first source electrode 216a, the first insulating layer 113, the second insulating layer 115, and the diffusion prevention layer 240. The first insulating layer 113 and the second insulating layer 115 may be a dielectric of the capacitor 22.

The capacitor 22 is located between the first transistor 21 and the second transistor 23, and is configured to store a driving voltage for driving the second transistor 23 during one frame. The capacitor 22 includes the first electrode 222 coupled to the drain electrode 216b of the first transistor 21, the second electrode 226 electrically coupled to the driving wire 25, and the first insulating layer 113 and the second insulating layer 115 interposed between the first electrode 222 and the second electrode 226. The second electrode 226 overlaps the first electrode 222 and is positioned on the first electrode 222.

The first electrode 222 of the capacitor 22 may be formed of substantially the same material on the same layer as the first gate electrode 212 of the first transistor 21. The second electrode 226 of the capacitor 22 may be formed of substantially the same material on the same layer as the source electrode 216a of the first transistor 21.

According to an embodiment of the present invention, the capacitor area CAP1 includes the diffusion prevention layer 240 configured to protect the second electrode 226 of the capacitor 22. The diffusion prevention layer 240 covers a patterning cross-section of the second electrode 226, and substantially prevents a direct contact between a metal layer included in the second electrode 226 and either the planarization layer 117 or the third insulating layer 119. Also, as described above, the diffusion prevention layer 240 may cover an inclined surface of the planarization layer 117 defined by the opening C7 exposing the second electrode 226.

This structure of the capacitor 22, however, is not limited thereto. For example, an active layer of a thin film transistor and a conductive layer of a gate electrode thereof may be respectively used (e.g., utilized) as a first electrode and a second electrode of the capacitor 22, and a gate insulating layer may be used as the dielectric layer of the capacitor 22.

Figure 5A:
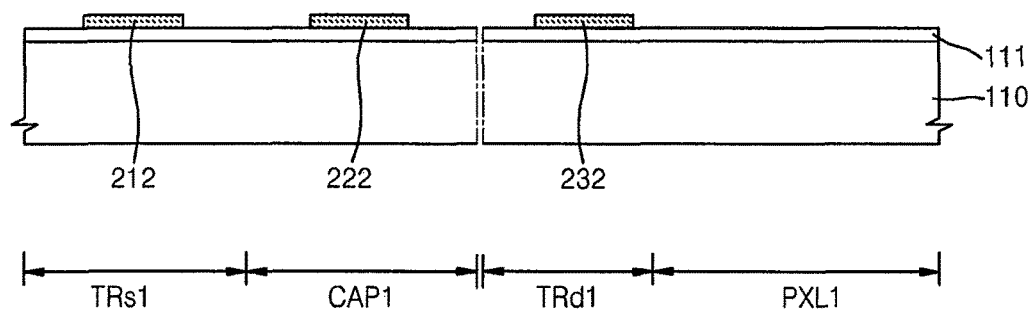
FIGS. 5A to 5G are views illustrating a method of manufacturing a display apparatus, according to an embodiment of the present invention.

Hereinafter, a method of manufacturing a display apparatus, according to an embodiment of the present invention, will be described in detail with reference to FIGS. 5A to 5G. FIG. 5A is a schematic cross-sectional view of the display apparatus 1 to illustrate a first mask process according to the present embodiment.

Referring to FIG. 5A, the buffer layer 111 is formed on the substrate 110, and a first metal layer is stacked on the buffer layer 111 and patterned. In this regard, the first metal layer may be formed to have a single or multi-layer structure by using (e.g., utilizing) at least one metal selected from aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu).

The patterning results in the formation of the first gate electrode 212 of the first transistor 21, the second gate electrode 232 of the second transistor 23, and the first electrode 222 of the capacitor 22 on the buffer layer 111.

After a photoresist is coated on the first metal layer, the first metal layer is patterned by photolithography using (e.g., utilizing) a first photomask to form the first gate electrode 212, the second gate electrode 232, and the first electrode 222. The first mask process including photolithography may be performed such that light is irradiated through the first photomask by using an exposure device, and then, developing, etching, and stripping or ashing are performed.

Figure 5B:
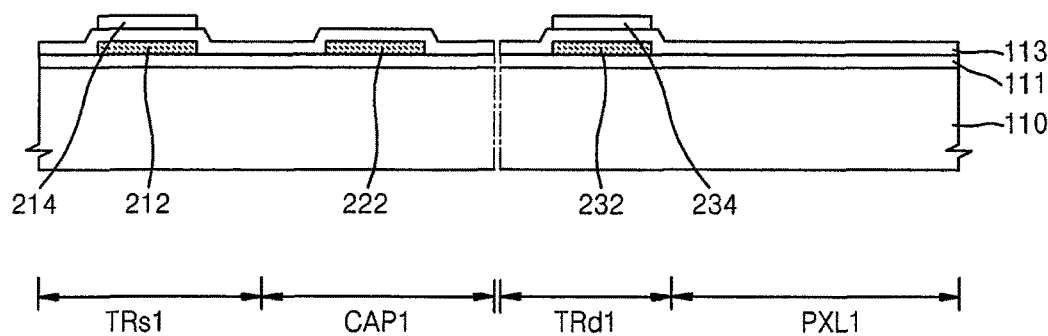

FIG. 5B is a schematic cross-sectional view of the display apparatus 1 to illustrate a second mask process according to the present embodiment.

The first insulating layer 113 is formed on the first gate electrode 212, the second gate electrode 232, and the first electrode 222 shown in FIG. 5A, and a semiconductor layer is formed on the first insulating layer 113. The semiconductor layer is patterned to form the first active layer 214 of the first transistor 21 and the second active layer 234 of the second transistor 23.

The first active layer 214 and the second active layer 234 may include an oxide semiconductor. For example, the semiconductor layer may include G-I—Z—O[a(In$_2$O$_3$)$_b$ (Ga$_2$O$_3$)$_c$(ZnO) layer](a, b, and c are respectively real numbers complying with conditions of a≥0, b≥0, and c>0), and according to another embodiment, the semiconductor layer may include an oxide of a material selected from Groups 12, 13, and 14 elements, such as zinc (Zn), indium (In), gallium (Ga), tin (Sn), cadmium (Cd), germanium (Ge), and hafnium (Hf), or a combination thereof.

Figure 5C:
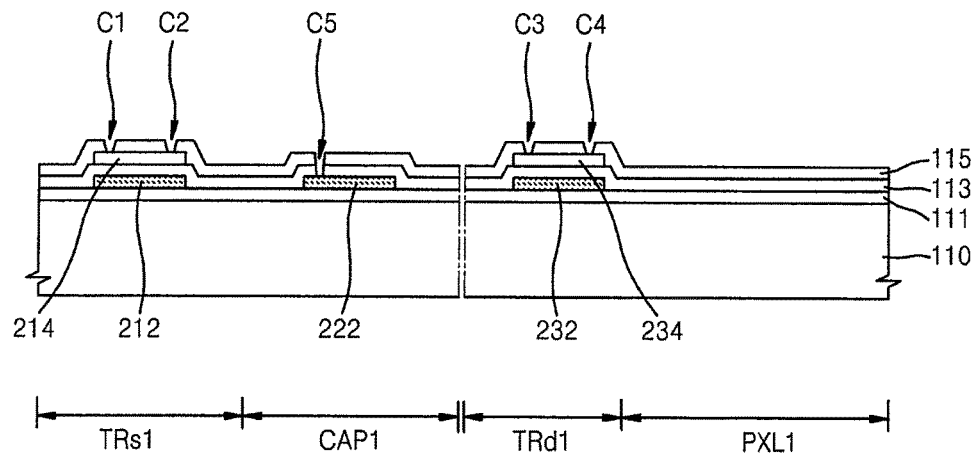

FIG. 5C is a schematic cross-sectional view of the display apparatus 1 to illustrate a third mask process according to the present embodiment.

The second insulating layer 115 is formed on the first active layer 214 and the second active layer 234 shown in FIG. 5B. The second insulating layer 115 is patterned to form openings C1, C2, C3, and C4 exposing an edge of the first active layer 214 and an edge of the second active layer 234, and to form an opening C5 exposing the first electrode 222 of the capacitor 22.

Figure 5D:
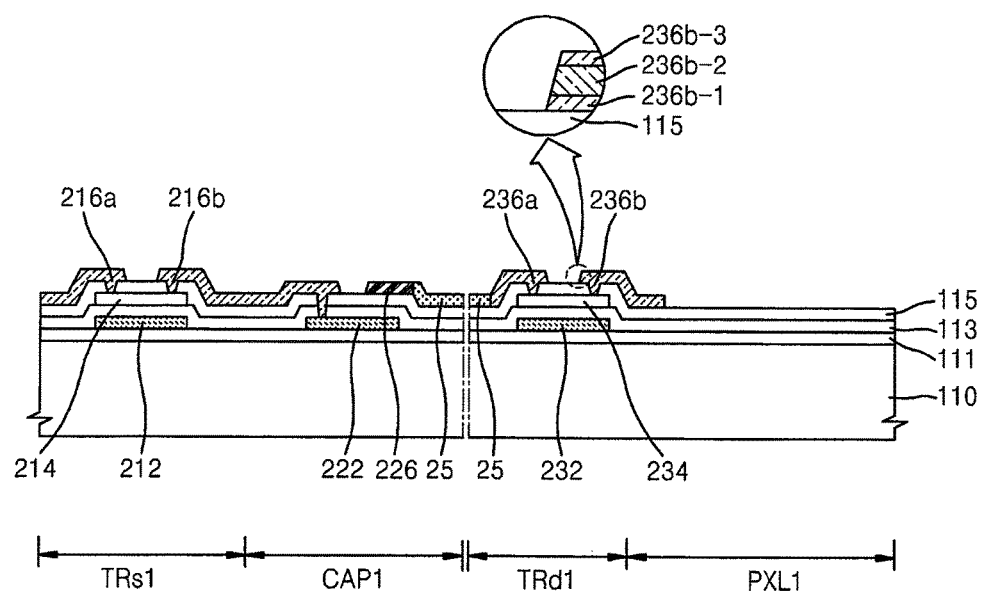

FIG. 5D is a schematic cross-sectional view of the display apparatus 1 to illustrate a fourth mask process according to the present embodiment.

Referring to FIG. 5D, a second metal layer is formed on the second insulating layer 115 shown in FIG. 5C. The second metal layer is then patterned to form a conductive layer pattern including the first source electrode 216a and the first drain electrode 216b of the first transistor 21, the second source electrode 236a and the second drain electrode 236b of the second transistor 23, the second electrode 226 of the capacitor 22, and the driving wire 25.

The second metal layer may include three layers that are continuously formed. A first layer, a second layer, and a third layer are continuously deposited, and the first layer and the third layer may each be a protection layer that protects the second layer. The second layer may include a copper (Cu) or copper alloy. The third layer and the first layer may each include indium tin oxide (ITO), indium zinc oxide (IZO), molybdenum (Mo), molybdenum nitride (MoN), molybdenum-niobium (MoNb), molybdenum-vanadium (MoV), molybdenum-titanium (MoTi), and/or molybdenum-tungsten (MoW).

As illustrated in FIG. 5D, the three layer structure of the second metal layer is substantially the same as the structure of the second drain electrode 236b described above with reference to FIG. 4. For example, the second metal layer according to the present embodiment includes a second barrier layer 236b-1 including indium tin oxide (ITO), a metal layer 236b-2 including copper (Cu), and a first barrier layer 236b-3 including indium tin oxide (ITO).

The metal layer 236b-2 including copper (Cu) is a metal layer having a low resistance and excellent electric characteristics. The second barrier layer 236b-1 including indium tin oxide (ITO) positioned under the metal layer 236b-2 enhances an adhesive force with respect to the second insulating layer 115. The first barrier layer 236b-3 including indium tin oxide (ITO) positioned above the metal layer 236b-2 may act as a barrier layer to substantially prevent heel lock, oxidation, and diffusion of copper (Cu) included in the metal layer 236b-2. The first barrier layer 216a-3 may block a reaction between the copper (Cu) included in the metal layer 236b-2 and an organic material included in the planarization layer 117 to substantially prevent diffusion of copper (Cu).

Figure 5E:
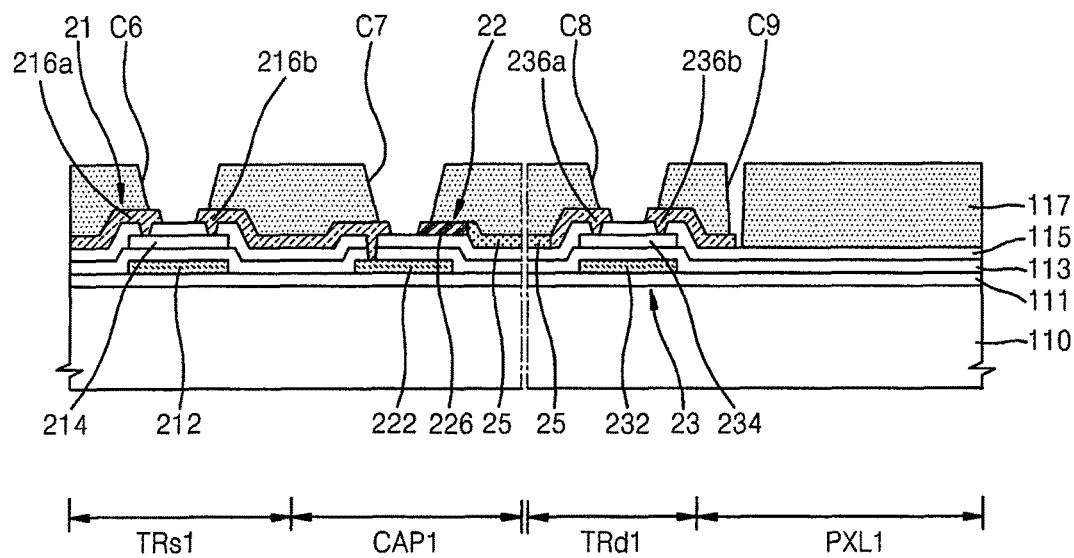

FIG. 5E is a schematic cross-sectional view of the display apparatus 1 to illustrate a fifth mask process according to the present embodiment.

Referring to FIG. 5E, the planarization layer 117, which is an insulating layer, is formed on the first source electrode 216a and the first drain electrode 216b of the first transistor 21, the second source electrode 236a and the second drain electrode 236b of the second transistor 23, the second electrode 226 of the capacitor 22, and the driving wire 25 shown in FIG. 5D. The planarization layer 117 is then patterned to form an opening and a contact hole, which exposes a patterning cross-section of the conductive layer pattern formed in the process explained with reference to FIG. 5D. In more detail, the opening C6 is formed to expose the inclined surface of one side of each of the first source electrode 216a and first drain electrode 216b of the first transistor 21. The opening C7 is formed to expose the patterning cross-sections of the first drain electrode 216b, and the second electrode 226 of the capacitor 32. The opening C8 is formed to expose the patterning cross-section of the second source electrode 236a and second drain electrode 236b of the second transistor 23. And a contact hole C9 is formed to expose an upper portion and a patterning cross-section of the second drain electrode 236b. The term "patterning cross-section" refers to an inclined surface of a portion of the second metal layer that is exposed when the second metal layer is patterned during the fourth mask process explained with reference to FIG. 5D, and according to an embodiment of the present invention, the patterning cross-section may indicate an etch surface.

According to an embodiment of the present invention, when the planarization layer 117 is formed on the second metal layer, the planarization layer 117 is patterned to not contact the patterning cross-section of the second metal layer.

The planarization layer 117 may be an organic insulating layer, and in this case, the planarization layer 117 may act as a planarization film. The organic insulating layer may include a commercially available polymer PMMA, PS, a polymer derivative having a phenol group, an aryl-based polymer, an imide-based polymer, an arylether-based polymer, an amide-based polymer, a fluorine-based polymer, a p-xylene-based polymer, a vinyl alcohol-based polymer, or a blend thereof.

Figure 5F:
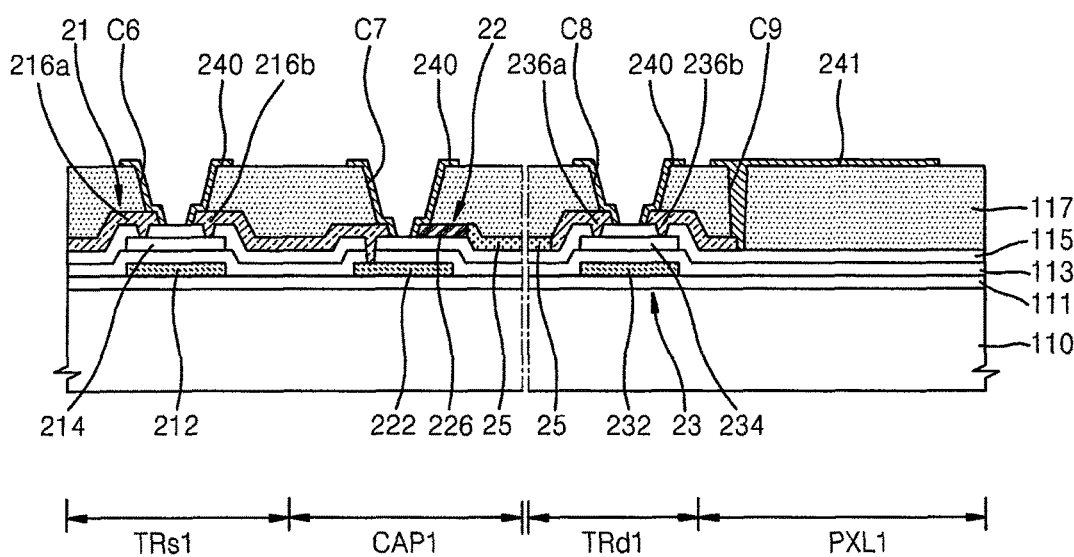

FIG. 5F is a schematic cross-sectional view of the display apparatus 1 to illustrate a sixth mask process according to the present embodiment.

Referring to FIG. 5F, a third conductive layer is formed on the planarization layer 117 shown in FIG. 5E. The third conductive layer is then patterned to form the diffusion prevention layer 240 covering the inclined surfaces of the planarization layer 117 exposed by the openings C6, C7, and C8 of the planarization layer 117, and the patterning cross-section of the second conductive layer. The patterning cross-section of the second conductive layer may include the patterning cross-sections of the first source electrode 216a and first drain electrode 216b of the first transistor 21, the patterning cross-section of the second electrode 226 of the capacitor 22, and the patterning cross-sections of the second source electrode 236a and second drain electrode 236b of the second transistor 23. Also, the pixel electrode 241 is formed to contact the second drain electrode 236b through the contact hole C9 of the planarization layer 117.

When the display apparatus according to an embodiment of the present invention is a bottom emission display device, the third conductive layer may constitute a transmissible electrode. When the display apparatus according to another embodiment of the present invention is a top emission display device, the third conductive layer may constitute a reflective electrode.

When the display apparatus according to an embodiment of the present invention is a bottom emission display device, the third conductive layer may include at least one selected from indium tin oxide (ITO), indium zinc oxide (IZO), zinc oxide (ZnO), indium oxide ($In_2O_3$), indium gallium oxide (IGO), and aluminum zinc oxide (AZO). According to an embodiment, the third conductive layer may have a three-layered structure of a transmissible conductive oxide layer/a semi-transmissible metal layer/another transmissible conductive oxide layer.

When the display apparatus according to an embodiment of the present invention is a top emission display device, the third conductive layer may be formed such that a reflective film (formed to include aluminum (Al), platinum (Pt), palladium (Pd), silver (Ag), magnesium (Mg), gold (Au), nickel (Ni), neodymium (Nd), iridium (Ir), chromium (Cr), magnesium (Mg), or a mixture thereof, and then, indium tin oxide (ITO), indium zinc oxide (IZO), zinc oxide (ZnO), indium oxide ($In_2O_3$), indium gallium oxide (IGO), and/or aluminum zinc oxide (AZO)) is deposited thereon.

Figure 5G:
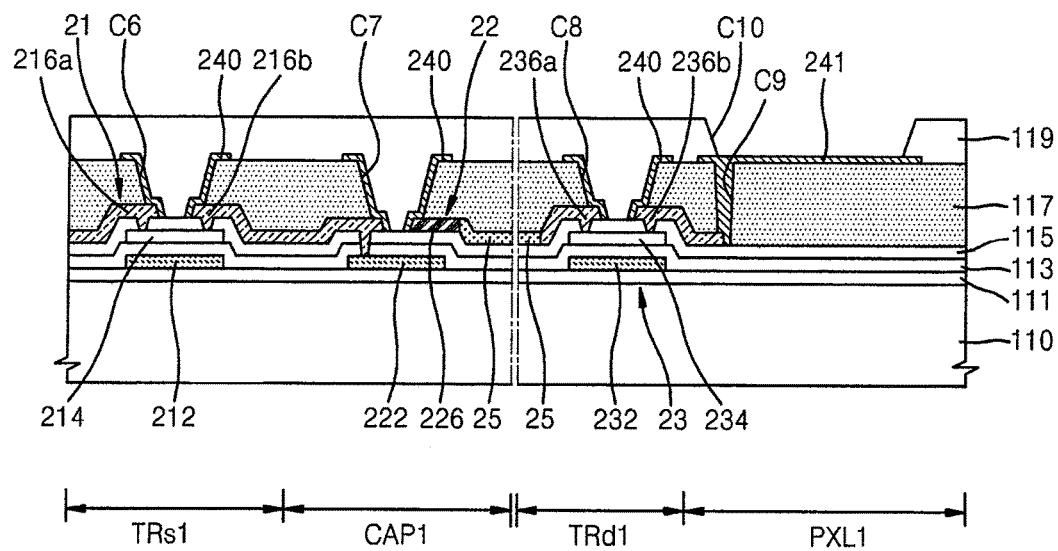

FIG. 5G is a schematic cross-sectional view of the display apparatus 1 to illustrate a seventh mask process according to the present embodiment.

Referring to FIG. 5G, the third insulating layer 119 is formed on the diffusion prevention layer 240 and the patterning cross-section of the second conductive layer shown in FIG. 5F. Then, an opening C10 is formed to expose an upper portion of the pixel electrode 241.

The third insulating layer 119 may act as a pixel-defining film, and may be an organic insulating layer including, for example, a commercially available polymer PMMA, PS, a polymer derivative having a phenol group, an aryl-based polymer, an imide-based polymer, an arylether-based polymer, an amide-based polymer, a fluorine-based polymer, a p-xylene-based polymer, a vinylalcohol-based polymer, or a blend thereof.

According to an embodiment of the present invention, the third insulating layer 119 fills the openings C6, C7, and C8 of the planarization layer 117. However, due to the presence of the diffusion prevention layer 240, the third insulating layer 119 does not contact the first source electrode 216a and first drain electrode 216b of the first transistor 21, the second electrode 226 of the capacitor 22, and the second source electrode 236a and second drain electrode 236b of the second transistor 23.

After the seventh mask process is performed as illustrated with reference to FIG. 5G, the intermediate layer 242 (see FIG. 4) including an organic light-emitting layer is formed on the exposed upper portion of the pixel electrode 241, and the opposite electrode 243 is formed on the intermediate layer 242 (see FIG. 4).

Hereinafter, a display apparatus 2 according to a second embodiment of the present invention will be described in more detail with reference to FIGS. 6 to 8, which illustrate a display apparatus using (e.g., utilizing) a top-gate thin film transistor as either a driving transistor or a switching transistor, according to another embodiment of the present invention.

Figure 6:
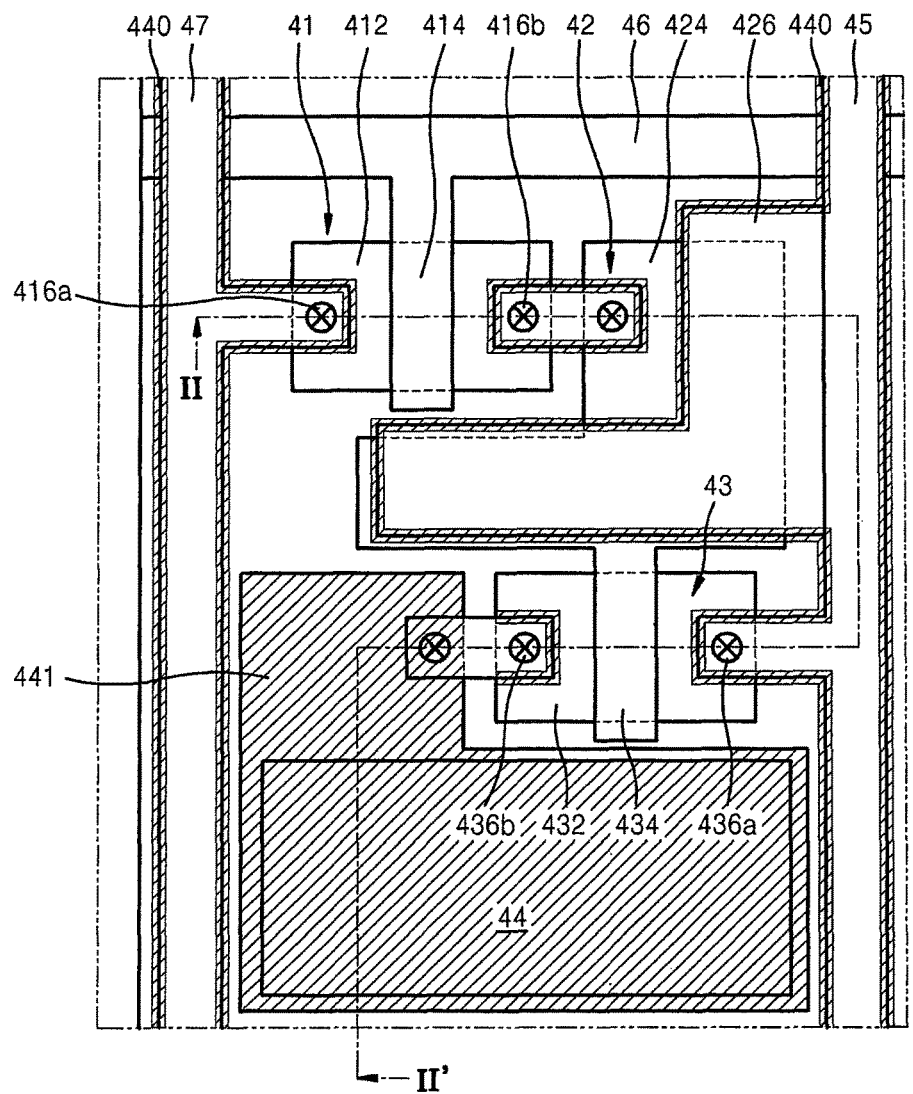
FIG. 6 is an enlarged view of a portion of a display area according to another embodiment of the present invention.

FIG. 6 is an enlarged view of a portion of the display area DA according to another embodiment of the present invention. FIG. 7 is a cross-sectional view taken along the line II-II' of FIG. 6.

Figure 7:
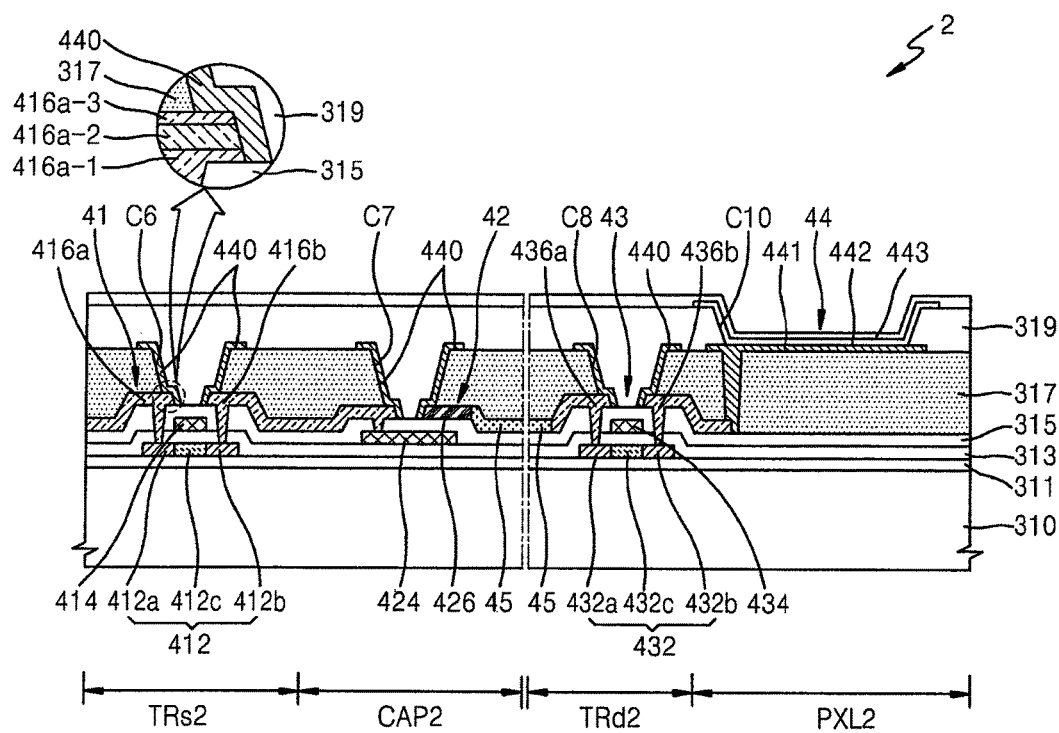
FIG. 7 is a cross-sectional view taken along the line II-II' of FIG. 6.

Referring to FIG. 7, a first transistor area TRs2 including at least one switching thin film transistor, a capacitor area CAP2 including at least one storage capacitor, a second transistor area TRd2 including at least one driving thin film transistor, and a pixel area PXL2 including at least one organic layer are positioned on a substrate 310.

The first transistor area TRs2 includes the substrate 310, a buffer layer 311, a first transistor 41, and a diffusion prevention layer 440. The first transistor 41 includes a first active layer 412, a first gate electrode 414, a first source electrode 416a, and a first drain electrode 416b. The first source electrode 416a is coupled (e.g., connected) to a data wire 27 to provide a data signal to the first active layer 412. The first drain electrode 416b is coupled to a first electrode 424 of a capacitor 42 to store a data signal in the capacitor 42.

The substrate 310 may be a glass substrate, or a plastic substrate including polyethylene terephthalate (PET), polyethylene naphthalate (PEN), or polyimide.

The buffer layer 311 may be further positioned on the substrate 310 to form a flat surface, and to substantially prevent permeation of impurity elements. The buffer layer 311 may have a single or multi-layered structure, formed of at least one selected from silicon nitride and silicon oxide.

In the first transistor area TRs2, the first active layer 412 is positioned on the buffer layer 311. The first active layer 412 may be formed of a semiconductor including amorphous silicon or crystalline silicon. The first active layer 412 may include a channel area 412c, a source area 412a, and a drain area 412b. The source area 412a and the drain area 412b may be located next to (e.g., adjacent to) the channel area 412c, and may be doped with ion impurities.

The first gate electrode 414 is positioned on the first active layer 412, corresponding to the channel area 412c of the active layer 412, with the first insulating layer 313 that is a gate insulating layer interposed therebetween. The first gate electrode 414 may be formed of substantially the same material as that used to form the first gate electrode 212 described above with reference to FIG. 4.

The first source electrode 416a and the first drain electrode 416b are positioned on the first gate electrode 414, and are respectively coupled to the source area 412a and the drain area 412b of the active layer 412, with a second insulating layer 315 that is an interlayer insulating layer interposed therebetween.

The first source electrode 416a and the first drain electrode 416b may include a metal layer 416a-2, a first barrier layer 416a-3 positioned above the metal layer 416a-2, and a second barrier layer 416a-1 positioned underneath the metal layer 416a-2.

The metal layer 416a-2 may include copper or a copper alloy. The first barrier layer 416a-3 may substantially prevent diffusion of a material included in the metal layer 416a-2, and oxidation of the metal layer 416a-2. The second barrier layer 416a-1 may substantially prevent diffusion of a material included in the metal layer 416a-2 into layers underneath the metal layer 416a-2, and may increase an adhesive force with the second insulating layer 315 positioned below the metal layer 416a-2. The first source electrode 416a and the first drain electrode 416b illustrated in FIG. 7, may have substantially the same structure formed of substantially the same material as the first source electrode 216a and the first drain electrode 216b illustrated in FIG. 4, respectively. Similar to the first source electrode 416a and the first drain electrode 416b, a different conductive layer pattern that is formed of substantially the same material on substantially the same layer as the first source electrode 416a may have substantially the same layered structure as the first source electrode 416a. For example, a second source electrode 436a, a second drain electrode 436b, the data wire 47, the driving wire 45, and/or a second electrode 426 of the capacitor 42 may have substantially the same layered structure as the first source electrode 416a.

A planarization layer 317 is positioned on the second insulating layer 315 to cover the first source electrode 416a and the first drain electrode 416b.

The planarization layer 317 may be an organic insulating layer. The planarization layer 317 may include a commercially available polymer PMMA, PS, a polymer derivative having a phenol group, an aryl-based polymer, an imide-based polymer, an arylether-based polymer, an amide-based polymer, a fluorine-based polymer, a p-xylene-based polymer, a vinylalcohol-based polymer, or a blend thereof.

A third insulating layer 319 is disposed on the planarization layer 317. The third insulating layer 319 may be an organic insulating layer. The third insulating layer 319 may include a commercially available polymer PMMA, PS, a polymer derivative having a phenol group, an aryl-based polymer, an imide-based polymer, an arylether-based polymer, an amide-based polymer, a fluorine-based polymer, a p-xylene-based polymer, a vinylalcohol-based polymer, or a blend thereof.

In the embodiment described with reference to FIG. 7, when the side of the metal layer 416a-2 pattern directly contacts an organic insulating layer, a metal material diffused through the organic insulating layer may diffuse into the other layers of the display apparatus 2. The diffused metal material may cause defects in the display apparatus 2, leading to a decrease in display quality.

According to an embodiment of the present invention, to substantially prevent the direct contact between the metal layer 416a-2 of the patterning cross-section of the first source electrode 416a and an organic film, such as the planarization layer 317 or the third insulating layer 319, the diffusion prevention layer 440 may be formed along the patterning cross-section of the first source electrode 416a. Referring to FIG. 7, an opening C6 is formed in the planarization layer 317 disposed on the first source electrode 416a. Along the opening C6 of the planarization layer 317, the diffusion prevention layer 440 may be formed to cover the patterning cross-section of the first source electrode 416a. Since the diffusion prevention layer 440 substantially prevents the direct contact between the patterning cross-section of the first source electrode 416a and an organic insulating film material, diffusion may be substantially prevented from occurring.

The diffusion prevention layer 440 is formed of substantially the same material on substantially the same layer as the pixel electrode 441 of the pixel area PXL1, which will be described in more detail. Accordingly, even without an additional use of a mask, a source electrode and a drain electrode of a thin film transistor may be protected.

In the embodiment described above, the diffusion prevention layer 440 is provided to protect the patterning cross-section of the first source electrode 416a. However, the diffusion prevention layer 440 may also be applicable to the first drain electrode 416b. The diffusion prevention layer 440 may also be applicable to a different conductive layer that is formed of substantially the same material on substantially the same layer as the first source electrode 416a and the first drain electrode 416b, along the patterning cross-section of the different conductive layer in substantially the same way as applied to the first source electrode 416a. For example, the diffusion prevention layer 440 may be formed along the patterning cross-sections of the second source electrode 436a, the second drain electrode 436b, the data wire 47, the driving wire 45, and/or the electrode 426 of the capacitor 42.

In more detail, referring to FIG. 6, the diffusion prevention layer 440 is shown according to an embodiment of the present invention. Referring to FIG. 6, the diffusion prevention layer 440 is formed along patterning cross-sections of the first source electrode 416a, the first drain electrode 416b, the second source electrode 436a, the second drain electrode 436b, the data wire 47, the driving wire 45, and the second electrode 426 of the capacitor 42.

The second transistor area TRd2 includes the second transistor 43 corresponding to the first transistor 41 of the first transistor area TRs2. In more detail, a second active layer 432, a second gate electrode 434, the second source electrode 436a, and the second drain electrode 436b of the second transistor 43, respectively, correspond to the first active layer 412, the first gate electrode 414, the first source electrode 416a, and the first drain electrode 416b of the first transistor 41.

The second source electrode 436a of the second transistor 43 is coupled to the driving wire 25, and supplies a reference voltage to the second active layer 432. The second drain electrode 436b couples the second transistor 43 to the light-emitting device 44 to apply a driving power to the light-emitting device 44.

The pixel area PXL2 includes the light-emitting device 44 including the pixel electrode 441, an intermediate layer 442, and an opposite electrode 443. The detailed description of the respective elements of the pixel area PXL1 according to the embodiment described above with reference to FIG. 4, may also be applicable with regards to the description of the respective elements of the pixel area PXL2 according to the embodiment shown in FIG. 7.

The capacitor area CAP2 includes a capacitor 42 including the first electrode 424 positioned on substantially the same layer as the first gate electrode 414, and a second electrode 426 positioned on substantially the same layer as the first source electrode 416a. The detailed description above regarding the respective elements of the capacitor area CAP1 according to the embodiment described above with reference to FIG. 4, may also be applicable in describing the respective elements of the capacitor area CAP2 according to the embodiment shown in FIG. 7.

Hereinafter, by referring to FIGS. 8A to 8G, a method of manufacturing the display apparatus 2, according to another embodiment of the present invention, will be described in more detail.

Figure 8A:
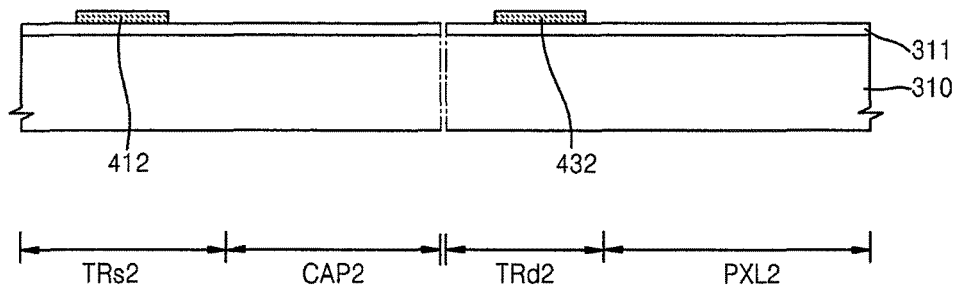
FIGS. 8A to 8G are views illustrating a method of manufacturing a display apparatus, according to another embodiment of the present invention.

FIG. 8A is a schematic cross-sectional view of the display apparatus 2 illustrating a first mask process according to the present embodiment.

Referring to FIG. 8A, the buffer layer 311 is formed on the substrate 310, and a semiconductor layer is formed on the buffer layer 311. Then, the semiconductor layer is patterned to form the first active layer 412 of the first transistor 41 and the second active layer 432 of the second transistor 43.

The semiconductor layer may be formed of amorphous silicon or crystalline silicon poly silicon. In this regard, the crystalline silicon may be formed by crystallizing amorphous silicon. The crystallizing of amorphous silicon may be performed by, for example, rapid thermal annealing (RTA), solid phase crystallization (SPC), excimer laser annealing (ELA), metal induced crystallization (MIC), metal induced lateral crystallization (MILC), or sequential lateral solidification (SLS). However, the material for forming the semiconductor layer is not limited to amorphous silicon or crystalline silicon in embodiments of the present invention, and instead, for example, an oxide semiconductor may be used to form the semiconductor layer.

Figure 8B:
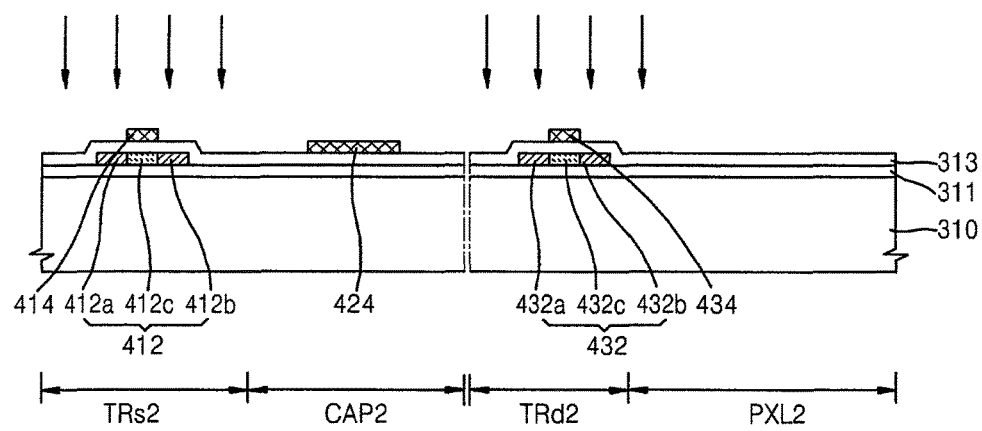

FIG. 8B is a schematic cross-sectional view of the display apparatus 2 illustrating a second mask process according to the present embodiment.

The first insulating layer 313 is formed on the first active layer 412 of the first transistor 41 and the second active layer 432 of the second transistor 43 shown in FIG. 8A. A first metal layer is deposited on the first insulating layer 313 and then patterned. In this regard, the first metal layer may be formed to have a single or multi-layer structure by using (e.g., utilizing) at least one metal selected from aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu).

The patterning results in the formation of the first gate electrode 414 of the first transistor 41, the second gate electrode 434 of the second transistor 43, and the first electrode 424 of the capacitor 42, on the first insulating layer 313.

Ion impurities are doped on the resultant structure. Ion impurities may enable doping of B ion or P ion, and may be doped targeting the first active layer 412 and the second active layer 432 at a doping concentration of $1 \times 10^{15}$ atoms/$cm^2$ or more.

Since ion impurities are doped on the first active layer 412 and the second active layer 432 by using (e.g., utilizing) the first gate electrode 414 and the second gate electrode 434 as a self-aligned mask, the first and second active layers 412 and 432 include the channel areas 412c and 432c between the ion-doped source areas 412a and 432a and the ion-doped drain areas 412b and 432b.

Figure 8C:
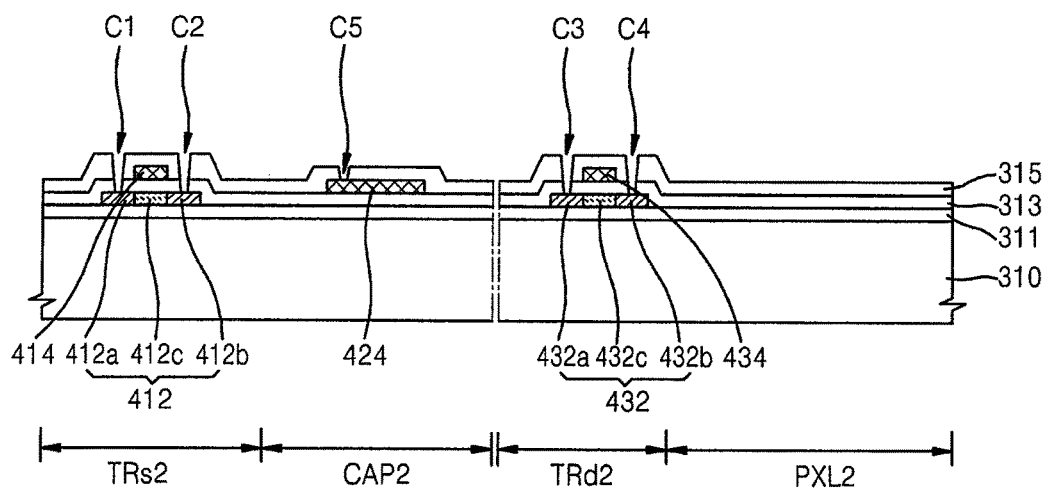

FIG. 8C is a schematic cross-sectional view of the display apparatus 2 illustrating a third mask process according to the present embodiment.

The second insulating layer 315 is formed on the first insulating layer 313 shown in FIG. 8B, and then, the second insulating layer 315 and the first insulating layer 313 are patterned to form openings C1 and C2 to expose the source area 412a and drain area 412b of the first active layer 412, openings C3 and 04 to expose the source area 432a and drain area 432b of the second active layer 432, and an opening C5 to expose the first electrode 424 of the capacitor 42.

Mask processes shown in FIGS. 8D to 8G correspond to the mask processes already described with reference to FIGS. 5D to 5G. Hereinafter, configurations already described with reference to FIGS. 5D to 5G that are substantially similar to those shown in FIGS. 8D to 8G will be omitted, or if provided, will only be briefly described.

Figure 8D:
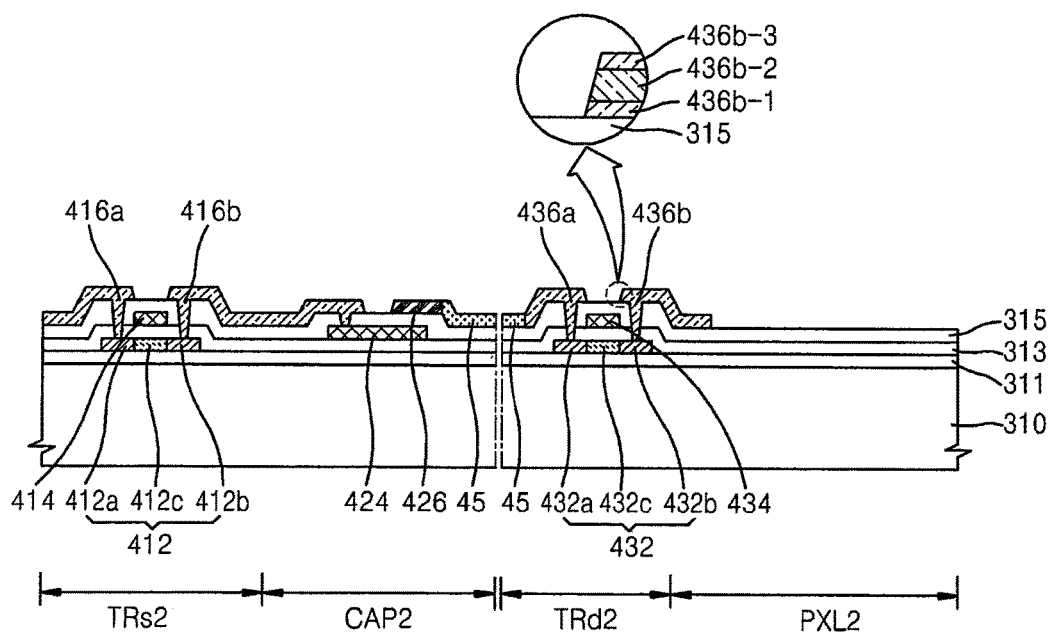

FIG. 8D is a schematic cross-sectional view of the display apparatus 2 illustrating a fourth mask process according to the present embodiment.

Referring to FIG. 8D, a second metal layer is formed on the second insulating layer 315 shown in FIG. 8C, and patterned to form the first source electrode 416a and first drain electrode 416b of the first transistor 41, the second source electrode 436a and second drain electrode 436b of the second transistor 43, the second electrode 426 of the capacitor 42, and the driving wire 45.

The second metal layer may include three layers that are continuously formed. A first layer, a second layer, and a third layer are continuously deposited, and the first layer and the third layer may each be a protection layer that is used (e.g., utilized) to protect the second layer. The second layer may include a copper (Cu) or copper alloy. The third layer and the first layer may each include indium tin oxide (ITO), indium zinc oxide (IZO), molybdenum (Mo), molybdenum nitride (MoN), molybdenum-niobium (MoNb), molybdenum-vanadium (MoV), molybdenum-titanium (MoTi), and/or molybdenum-tungsten (MoW).

A structure of the second metal layer is described with reference to the detailed structure of the second drain electrode 436b illustrated in FIG. 8D. For example, the second metal layer according to the present embodiment may include a second barrier layer 436b-1 including indium tin oxide (ITO), a metal layer 436b-2 including copper (Cu), and a first barrier layer 436b-3 including indium tin oxide (ITO).

Figure 8E:
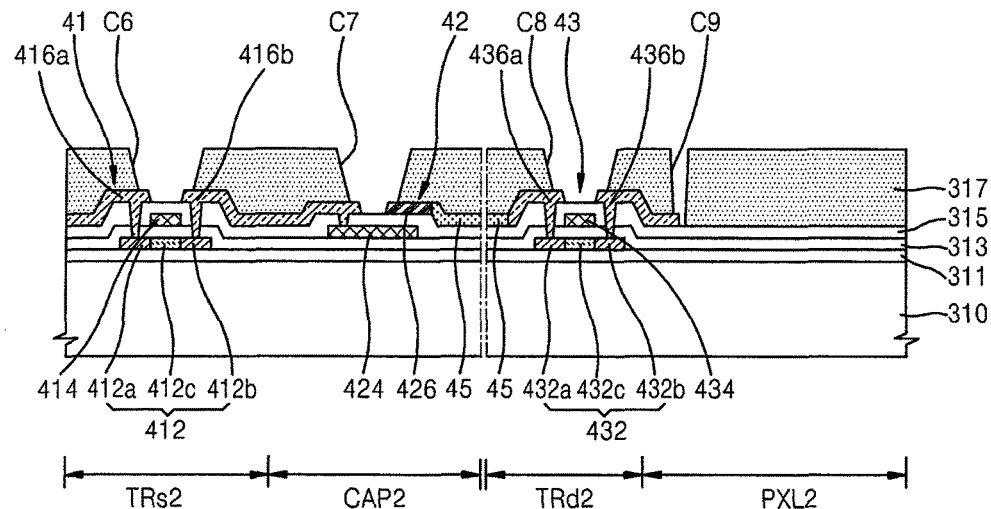

FIG. 8E is a schematic cross-sectional view of the display apparatus 2 illustrating a fifth mask process according to the present embodiment.

Referring to FIG. 8E, the planarization layer 317 is formed on the first source electrode 416a and first drain electrode 416b of the first transistor 41, the second source electrode 436a and second drain electrode 436b of the second transistor 43, the second electrode 426 of the capacitor 42, and the driving wire 45 shown in FIG. 8D. The planarization layer 317 is patterned to form an opening C6 exposing an inclined surface of one side of each of the first source electrode 416a and first drain electrode 416b of the first transistor 41, an opening C7 exposing an inclined surface of the first drain electrode 416b and an inclined surface of the second electrode 426 of the capacitor 32, an opening C8 exposing the patterning cross-sections of the second source electrode 436a and second drain electrode 436b of the second transistor 43, and a contact hole C9 exposing an upper portion and patterning cross-section of the second drain electrode 436b. The term 'patterning cross-section' refers to an inclined surface of a portion of the second metal layer that is exposed when the second metal layer is patterned in the fourth mask process described above with reference to FIG. 8D.

Figure 8F:
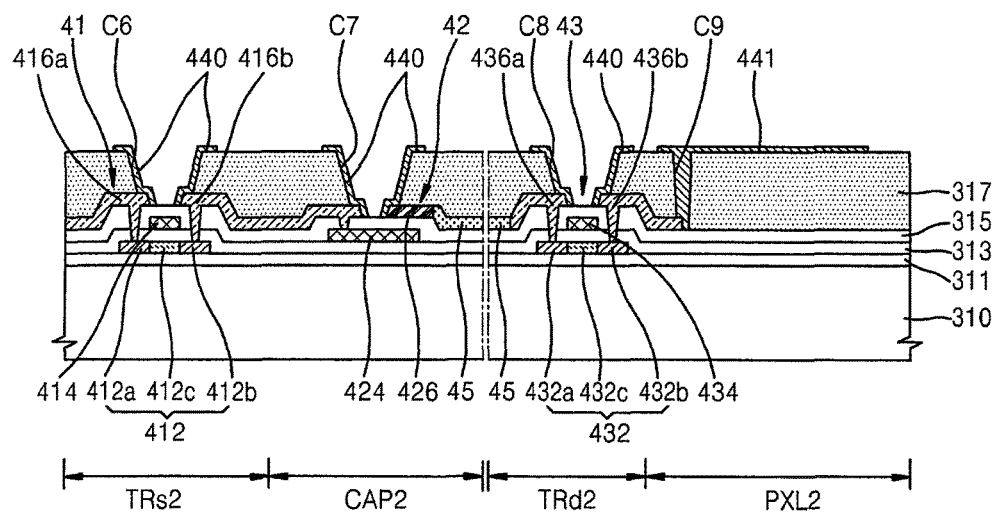

FIG. 8F is a schematic cross-sectional view of the display apparatus 2 illustrating a sixth mask process according to the present embodiment. Referring to FIG. 8F, a third conductive layer is formed on the planarization layer 317 shown in FIG. 8E, and patterned to form the diffusion prevention layer 440 and the pixel electrode 441. The diffusion prevention layer 440 covers the patterning cross-section of the second conductive layer along inclined surfaces of the planarization layer 317 exposed by the openings C6, C7, and C8 of the planarization layer 317.

Figure 8G:
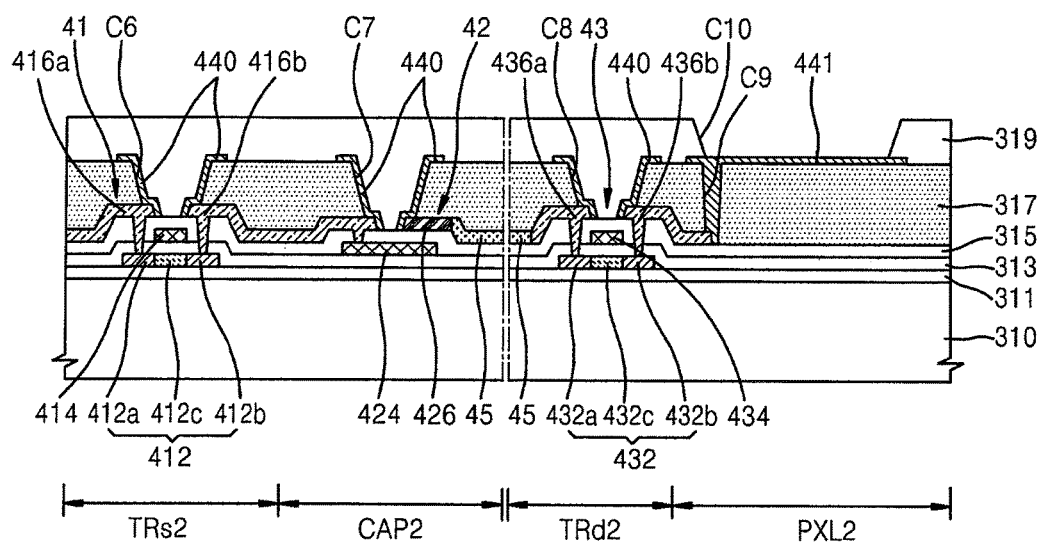

FIG. 8G is a schematic cross-sectional view of the display apparatus 2 illustrating a seventh mask process according to the present embodiment.

Referring to FIG. 8G, the third insulating layer 319 is formed on the diffusion prevention layer 440 and the pixel electrode 441 shown in FIG. 8F. Then, an opening C10 is formed exposing an upper portion of the pixel electrode 441.

The intermediate layer 442 (see FIG. 7) including an organic light-emitting layer is formed on the exposed upper portion of the pixel electrode 441, and the opposite electrode 443 is formed on the intermediate layer 442 (see FIG. 7).

Figure 9:
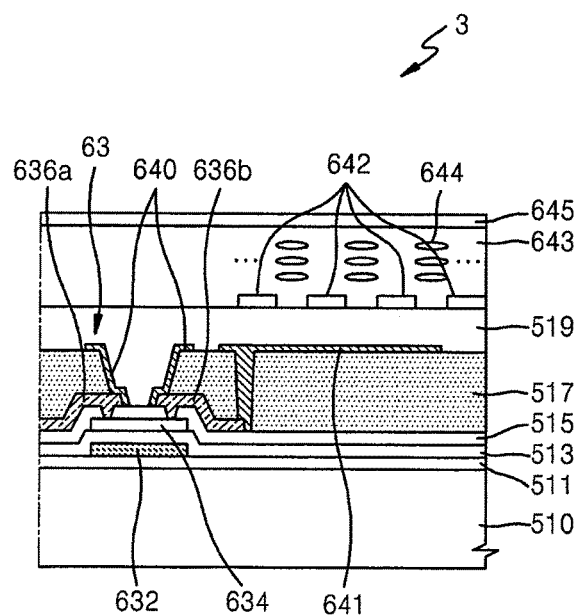
FIG. 9 is a schematic cross-sectional view of a display apparatus according to a third embodiment of the present invention

FIG. 9 is a schematic cross-sectional view of a display apparatus 3 according to a third embodiment of the present invention. The display apparatus 3 of FIG. 3 may be a liquid-crystal display that displays an image by controlling a transmittance of light according to a pixel by using (e.g., utilizing) an orientation of a liquid crystal layer that changes according to an electric field.

The display apparatus 3 of FIG. 9 includes a transistor 63 including a gate electrode 632, an active layer 634, a source electrode 636a, and a drain electrode 636b. The gate electrode 632, the active layer 634, the source electrode 636a, and the drain electrode 636b, which are illustrated in FIG. 9, may respectively correspond to the second gate electrode 232, the second active layer 234, the second source electrode 236a, and the second drain electrode 236b shown in FIG. 4. Similar to the embodiment described with reference to FIG. 4 above, a conductive layer pattern including the source electrode 636a and the drain electrode 636b shown in FIG. 9, may include a metal layer including a copper or a copper alloy.

Likewise, a substrate 510, a buffer layer 511, a first insulating layer 513, a second insulating layer 515, and a planarization film 517 of the display apparatus 3 of FIG. 9 may respectively correspond to the substrate 110, the buffer layer 111, the first insulating layer 113, the second insulating layer 115, and the planarization film 117 of the display apparatus 1 shown in FIG. 4 and described above.

The source electrode 636a or the drain electrode 636b of the transistor 63 may contact the first electrode 641. The first electrode 641 may be formed of substantially the same material as the pixel electrode 241 illustrated in FIG. 4.

In the embodiment shown in FIG. 9, a protection layer 640 contacting cross-sections of the source electrode 636a and the drain electrode 636b is disposed on the same layer as the first electrode 641. The protection layer 640 may cover cross-sections of the conductive pattern including the source electrode 636a and the drain electrode 636b. The protection layer 640 may have substantially the same structure and effects as those of the diffusion prevention layer 240 described above. That is, the protection layer 640 may substantially prevent a direct contact between the conductive pattern including the source electrode 636a and the drain electrode 636b, and an organic insulating film material such as the planarization film 517 or the third insulating layer 519.

The third insulating layer 519 is formed on the first electrode 641. The third insulating layer 519 may be an organic insulating layer or an inorganic insulating layer. In more detail, the third insulating layer 519 may include a commercially available polymer PMMA, PS, a polymer derivative having a phenol group, an aryl-based polymer, an imide-based polymer, an arylether-based polymer, an amide-based polymer, a fluorine-based polymer, a p-xylene-based polymer, a vinylalcohol-based polymer, or a blend thereof.

A second electrode 642 is formed on the third insulating layer 519. The second electrode 642 may be formed of substantially the same material as the first electrode 641, and may include a transmissible conductive oxide. The second electrode 642 may generate a lateral electric field, together with the first electrode 641, to control the orientation of liquid crystal. Although in the embodiment shown in FIG. 9, the second electrode 642 and the first electrode 641 are disposed on different layers, in other embodiments, the second electrode 642 and the first electrode 641 may be disposed on the same layer.

A liquid crystal layer 643 may be interposed between the second pixel electrode 642 and a color filter 645. The liquid crystal layer 643 has dielectric anisotropy, and when an electric field is absent, liquid crystal molecules 644 of the liquid crystal layer 643 may be orientated such that their longer axes are perpendicular to surfaces of the display panels. Due to the first electrode 641 and the second electrode 642, an electric field substantially parallel to the substrate 510 may occur in the liquid crystal layer 643. When liquid crystal molecules 644 have a positive dielectric anisotropy, they are inclined such that their longer axes is parallel to the electric field, and the inclination degree may vary according to the intensity of pixel voltage. Also, according to the inclination degree of the liquid crystal molecules 644, a change in polarization of light passing through the liquid crystal layer 643 may be determined. This change of polarization may be embodied as a change in transmittance of light caused by a polarizer.

The color filter 645 is positioned on the liquid crystal layer 643, and may include a material containing a pigment for embodying red, green, and/or blue.

In the embodiment shown in FIG. 9, the display apparatus 3 is a lateral-electric field display apparatus in which the second electrode 642 is included at the side of the substrate 510. However, embodiments of the present invention are not limited thereto, as long as the transistor 63 includes the protection layer 640, and aspects of the embodiments are also applicable to any vertical-electric field display apparatus.

A thin film transistor substrate, a display apparatus, and a method of manufacturing the thin film transistor array substrate, according to embodiments of the present invention, provide the following effects.

First, diffusion occurring when a patterning cross-section of a metal layer including copper contacts an organic insulating layer may be substantially prevented.

Second, since a photomask process for forming an inorganic passivation to protect a metal layer is not needed, efficiency of the manufacturing process may increase.

While certain embodiments of the present invention have been illustrated and described, it is understood by those of ordinary skill in the art that certain modifications and changes can be made to the described embodiments without departing from the spirit and scope of the present invention as defined by the following claims, and equivalents thereof.

What is claimed is:

1. A thin film transistor array substrate comprising:
a thin film transistor comprising a gate electrode, an active layer, a source electrode, and a drain electrode;
a first conductive layer pattern on a same layer as the source electrode and the drain electrode and formed of a same material as the source electrode and the drain electrode;
an insulating layer on the first conductive layer pattern, the insulating layer having an opening exposing a patterning cross-section of the first conductive layer pattern;
a pixel electrode on the insulating layer and coupled to either the source electrode or the drain electrode through a contact hole passing through the insulating layer; and
a diffusion prevention layer covering the patterning cross-section of the first conductive layer pattern and inclined side surfaces of the insulating layer exposed through the opening.

2. The thin film transistor array substrate of claim 1, wherein the first conductive layer pattern comprises:
a metal layer comprising a copper or a copper alloy; and
a first barrier layer interposed between the metal layer and the insulating layer.

3. The thin film transistor array substrate of claim 2, wherein a patterning cross-section of the metal layer is flush with a patterning cross-section of the first barrier layer.

4. The thin film transistor array substrate of claim 2, wherein
the first barrier layer comprises indium tin oxide (ITO), indium zinc oxide (IZO), molybdenum (Mo), molybdenum nitride (MoN), molybdenum-niobium (MoNb), molybdenum-vanadium (MoV), molybdenum-titanium (MoTi), and/or molybdenum-tungsten (MoW).

5. The thin film transistor array substrate of claim 2, wherein
the first conductive layer pattern further comprises a second barrier layer underneath the metal layer.

6. The thin film transistor array substrate of claim 5, wherein
a patterning cross-section of the metal layer is flush with a patterning cross-section of the second barrier layer.

7. The thin film transistor array substrate of claim 5, wherein
the second barrier layer comprises indium tin oxide (ITO), indium zinc oxide (IZO), molybdenum (Mo), molybdenum nitride (MoN), molybdenum-niobium (MoNb), molybdenum-vanadium (MoV), molybdenum-titanium (MoTi), and/or molybdenum-tungsten (MoW).

8. The thin film transistor array substrate of claim 1, wherein
the first conductive layer pattern comprises the source electrode and the drain electrode of the thin film transistor, and/or an electrode of a capacitor, and/or a data wire, and/or a driving wire.

9. The thin film transistor array substrate of claim 1, wherein
the insulating layer comprises an organic insulating material.

10. The thin film transistor array substrate of claim 1, wherein
the insulating layer contacts an upper portion of the first conductive layer pattern.

11. The thin film transistor array substrate of claim 1, wherein
the diffusion prevention layer comprises a same material as the pixel electrode.

12. The thin film transistor array substrate of claim 1, wherein
the diffusion prevention layer contacts the patterning cross-section of the first conductive layer pattern.

13. The thin film transistor array substrate of claim 1, wherein
the diffusion prevention layer contacts the patterning cross-section of the insulating layer exposed through the opening.

14. The thin film transistor array substrate of claim 1, wherein
the diffusion prevention layer comprises a plurality of patterns insulated from each other.

15. The thin film transistor array substrate of claim 1, further comprising
a pixel-defining film on the insulating layer, the pixel-defining film comprising an opening exposing a top surface of the pixel electrode.

16. The thin film transistor array substrate of claim 15, wherein
the pixel-defining film comprises an organic insulating material.

17. The thin film transistor array substrate of claim 1, wherein
the thin film transistor is a bottom gate thin film transistor.

18. The thin film transistor array substrate of claim 1, wherein
the thin film transistor is a top gate thin film transistor.

19. An organic light-emitting display apparatus comprising:
a substrate;
a thin film transistor on the substrate and comprising a gate electrode, an active layer, a source electrode, and a drain electrode;
a first conductive layer pattern on a same layer as the source electrode and the drain electrode and formed of a same material as the source electrode and the drain electrode;

an insulating layer having an opening exposing a patterning cross-section of the first conductive layer pattern;

a pixel electrode on the insulating layer and coupled to either the source electrode or the drain electrode through a contact hole passing through the insulating layer;

a diffusion prevention layer covering the patterning cross-section of the first conductive layer pattern and inclined side surfaces of the insulating layer exposed through the opening;

an organic light-emitting layer on the pixel electrode; and an opposite electrode on the organic light-emitting layer.

20. The organic light-emitting display apparatus of claim 19, wherein at least one of the pixel electrode and the opposite electrode is a transmissible electrode.

21. A method of manufacturing a thin film transistor array substrate, the method comprising:

forming a thin film transistor comprising a gate electrode, an active layer, a source electrode, and a drain electrode on a substrate;

forming a first conductive layer pattern on a same layer as the source electrode and the drain electrode and of a same material as the source electrode and the drain electrode;

forming an insulating layer on the first conductive layer pattern, the insulating layer having an opening exposing a cross-section of the first conductive layer pattern;

forming a diffusion prevention layer covering the cross-section of the first conductive layer pattern and inclined side surfaces of the insulating layer exposed through the opening; and forming a pixel electrode coupled to the source electrode or the drain electrode, concurrently with the diffusion prevention layer.

22. The method of claim 21, wherein the forming of the first conductive layer pattern comprises:

forming a metal layer comprising a copper or a copper alloy;

continuously forming a first barrier layer on the metal layer in a same chamber; and concurrently patterning the metal layer and the first barrier layer.

23. The method of claim 22, wherein a second barrier layer is further formed underneath the metal layer, the second barrier layer, the metal layer, and the first barrier layer are continuously formed in a same chamber, and the second barrier layer, the metal layer, and the first barrier layer are concurrently patterned.

24. The method of claim 21 further comprising forming a pixel-defining film on the insulating layer, the pixel-defining film exposing a top surface of the pixel electrode.

25. The method of claim 24, wherein the insulating layer and the pixel-defining film each comprise an organic insulating material.

* * * * *